(12) United States Patent
Chen et al.

(10) Patent No.: US 10,002,744 B2
(45) Date of Patent: Jun. 19, 2018

(54) SYSTEM AND METHOD FOR CONTROLLING PLASMA DENSITY

(71) Applicant: Tokyo Electron Limited, Minato-ku, Tokyo (JP)

(72) Inventors: Lee Chen, Cedar Creek, TX (US); Peter L. G. Ventzek, Austin, TX (US); Barton G. Lane, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 248 days.

(21) Appl. No.: 14/571,806

(22) Filed: Dec. 16, 2014

(65) Prior Publication Data

US 2015/0170925 A1 Jun. 18, 2015

Related U.S. Application Data

(60) Provisional application No. 61/917,083, filed on Dec. 17, 2013.

(51) Int. Cl.
*H01J 37/32* (2006.01)

(52) U.S. Cl.
CPC .. *H01J 37/32045* (2013.01); *H01J 37/32174* (2013.01); *H01J 37/32642* (2013.01); *H01J 37/32935* (2013.01)

(58) Field of Classification Search
CPC .......... H01J 37/32045; H01J 37/32174; H01J 37/32642; H01J 37/32935;

(Continued)

(56) References Cited

U.S. PATENT DOCUMENTS 5,744,049 A * 4/1998 Hills ................. H01J 37/32082
216/67
6,592,710 B1 * 7/2003 Benjamin ............. H01J 37/321
118/723 AN (Continued)

FOREIGN PATENT DOCUMENTS

JP 2012-191200 A 10/2012

OTHER PUBLICATIONS

Office Action dated Dec. 16, 2015 in corresponding Taiwan Patent Application No. 103144058 (with an English translation) (9 pages).

(Continued)

*Primary Examiner* — Sophia Nguyen
(74) *Attorney, Agent, or Firm* — Rothwell, Figg, Ernst & Manbeck, P.C.

(57) ABSTRACT

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate. This disclosure relates to a plasma processing system that may include a power electrode that may be opposite a bias electrode and a focus ring electrode that surrounds the substrate. In one embodiment, the power electrode may be coupled to a direct current (DC) source. Power applied to the bias electrode may be used to draw ions to the substrate. The plasma density may be made more uniform by applying a focus ring voltage to the focus ring that is disposed around the substrate and/or the bias electrode.

10 Claims, 3 Drawing Sheets

(58) Field of Classification Search
CPC ........... H01J 37/32082; H01J 37/32091; H01J 37/32165; H01J 37/32568; H01J 37/32183; H01J 37/32027; H01L 21/67069; H01L 21/31116; H01L 21/31138; H01L 21/6831; H01L 21/3065; H01L 21/32136; H01L 21/6833; H01L 21/67253; H01L 21/68735

See application file for complete search history.

(56) References Cited

U.S. PATENT DOCUMENTS

| | | | | |
|---|---|---|---|---|
| 6,632,322 | B1* | 10/2003 | Gottscho | H01J 37/3244 118/715 |
| 7,244,475 | B2* | 7/2007 | Higashiura | H01J 37/32082 156/345.28 |
| 7,883,600 | B2* | 2/2011 | Sato | C03C 15/00 118/723 E |
| 8,303,834 | B2 | 11/2012 | Honda et al. | |
| 8,524,005 | B2* | 9/2013 | Miyagawa | H01J 37/32623 118/724 |
| 8,674,255 | B1* | 3/2014 | Lenz | B23K 10/003 219/121.43 |
| 2003/0201069 | A1* | 10/2003 | Johnson | H01J 37/32082 156/345.43 |
| 2004/0035365 | A1* | 2/2004 | Yamazawa | H01J 37/321 118/723 E |
| 2004/0074605 | A1* | 4/2004 | Nezu | H01J 37/32642 156/345.47 |
| 2004/0168640 | A1* | 9/2004 | Muto | C23C 4/02 118/728 |
| 2005/0230049 | A1* | 10/2005 | Nishio | H01J 37/32082 156/345.51 |
| 2006/0151116 | A1* | 7/2006 | Wu | C23F 4/00 156/345.46 |
| 2006/0196605 | A1* | 9/2006 | Ikegami | H01J 37/32082 156/345.51 |
| 2007/0084847 | A1* | 4/2007 | Koshimizu | F27B 5/04 219/390 |
| 2007/0113981 | A1* | 5/2007 | Brcka | H01J 37/321 156/345.48 |
| 2008/0105203 | A1* | 5/2008 | Mitsuhashi | C23C 14/564 118/723 R |
| 2008/0236749 | A1* | 10/2008 | Koshimizu | H01J 37/32091 156/345.33 |
| 2008/0237182 | A1* | 10/2008 | Yamawaku | H01J 37/3244 216/59 |
| 2009/0242127 | A1* | 10/2009 | Koshimizu | H01J 37/32091 156/345.28 |
| 2010/0025369 | A1* | 2/2010 | Negishi | H01J 37/32642 216/60 |
| 2010/0041240 | A1* | 2/2010 | Tsujimoto | H01J 37/32642 438/758 |
| 2010/0243606 | A1 | 9/2010 | Koshimizu et al. | |
| 2010/0326957 | A1* | 12/2010 | Maeda | H01J 37/20 216/67 |
| 2011/0024046 | A1 | 2/2011 | Keil et al. | |
| 2011/0162798 | A1* | 7/2011 | Zhang | H01J 37/32183 156/345.28 |
| 2011/0240221 | A1* | 10/2011 | Yamamoto | H01J 37/32091 156/345.28 |
| 2011/0272100 | A1* | 11/2011 | Koshiishi | H01J 37/32642 156/345.43 |
| 2012/0061351 | A1 | 3/2012 | Ohata et al. | |
| 2012/0216955 | A1 | 8/2012 | Eto et al. | |
| 2012/0252141 | A1* | 10/2012 | Sundararajan | H01J 37/32082 438/5 |
| 2012/0285623 | A1* | 11/2012 | Moriya | H01J 37/32431 156/345.47 |
| 2013/0020027 | A1 | 1/2013 | Kamijo | |
| 2013/0119017 | A1* | 5/2013 | Yang | H01J 37/32082 216/61 |
| 2013/0174105 | A1* | 7/2013 | Nishio | H01J 37/32082 716/54 |
| 2015/0170925 | A1* | 6/2015 | Chen | H01J 37/32045 438/758 |
| 2015/0243524 | A1* | 8/2015 | Kihara | H01L 21/31144 438/694 |
| 2015/0245460 | A1* | 8/2015 | Yoshida | H05B 7/18 373/22 |
| 2016/0163554 | A1* | 6/2016 | Funakubo | H01J 37/32146 438/714 |
| 2016/0259872 | A1* | 9/2016 | Howald | G06F 17/5063 |
| 2017/0194130 | A1* | 7/2017 | Lyndaker | H01J 37/32926 |

OTHER PUBLICATIONS

International Search Report and Written Opinion dated Mar. 26, 2015 in PCT/US2014/070526 (11 pages).

\* cited by examiner

SYSTEM AND METHOD FOR CONTROLLING PLASMA DENSITY

CROSS REFERENCE TO RELATED APPLICATION

Pursuant to 37 C.F.R. § 1.78(a)(4), this application claims the benefit of and priority to prior filed Provisional Application Ser. No. 61/917,083 filed Dec. 17, 2013, which is expressly incorporated herein by reference.

FIELD OF THE INVENTION

This invention relates to semiconductor processing technology, and more particularly, to apparatus and methods for controlling plasma properties of a processing system for treating a substrate.

BACKGROUND OF THE INVENTION

Plasma uniformity control during plasma processing for treating semiconductor substrates is important to achieve patterning structures on a substrate or controlling the amount of material removed from or deposited on or into the substrate. One aspect of process performance may be related to the plasma density across the substrate which may determine the uniformity of the plasma treatment across the substrate. In some instances, the plasma density near or at the edge of the substrate may vary at a higher rate than at the interior area of the substrate. The plasma density may vary due to the influence of the chamber wall or the focus rings that may be adjacent to the substrate. For example, the plasma ions may be attracted to or lost to the peripheral components (e.g., chamber wall, focus ring) caused by the potential difference between the interior and exterior portions inside the plasma chamber. Accordingly, systems and methods that can control or vary the potential difference to minimize the changes in plasma density at the edge of the substrate may be desirable.

SUMMARY OF THE INVENTION

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate.

The plasma chamber may include one or more plasma sources that can emit electromagnetic energy to ionize gas that is delivered via a gas delivery system. The plasma density across the substrate may be influenced by the potential difference between the plasma source, the chamber wall, the substrate, and/or other components (e.g., focus ring) adjacent to the substrate. The charged particles may be attracted to potential sources (e.g., chamber wall) that prevent charged particles from reaching the substrate. The loss of the charged particles to a chamber wall may result in plasma density non-uniformity that may induce substrate processing non-uniformity.

One approach to minimizing charged particle (e.g., ions) loss may be to alter the boundary potential proximate to the edge of the substrate in a way that may increase the plasma density at the edge of the substrate. The boundary potential or plasma sheath proximate to the substrate may be altered by controlling the potential difference between bias electrode below the substrate and the focus ring that maybe adjacent to the substrate. The focus ring may also provide support or be in physical contact with the edge of the substrate. However, the focus ring and bias electrode may be electrically isolated from each other and/or may not be in direct physical contact with each other. But, in some instances, there may be a very small capacitance between the bias electrode and the focus ring that has minimal effect on the potential difference between the bias electrode and the focus ring.

In one embodiment, the plasma processing chamber may include a vacuum chamber that may be used to treat the substrate with plasma generated by one or more power sources coupled to or within the chamber. The power sources may include, but are not limited to, an electrode or bias electrode that may be used to support the substrate and apply a voltage to gas or plasma within the chamber. The focus ring (e.g., dielectric materials like quartz, ceramic, etc.) may be around disposed around the electrode and/or the substrate. The focus ring and/or the bias electrode may be used to support the substrate. However, the focus ring and the bias electrode may be electrically isolated from each other and/or not physically contacting each other. In certain instances, the focus ring and the electrode may be a very small or minimal capacitance (e.g., pF) between each other that has no or minimal effect on each other's electrical performance. A counter electrode may be opposite the bias electrode or the substrate that may be used to ignite or strike plasma within the plasma processing chamber. The one or more power sources may be used to control, at least a portion of, the plasma density within the chamber. In one embodiment, the chamber may include a potential control circuit coupled to the bias electrode, the focus ring, and at least one power source. The potential control circuit may include a control component that may be used to apply different voltages to the focus ring and the bias electrode at the same or similar time. For example, in one instance, the potential control circuit may apply a lower voltage to the focus ring than the bias electrode. The control component(s) may include, but is not limited to, one or more variable capacitors that may be used to vary the voltages applied to the focus ring or the electrode. The control components may also include memory and a computer processor that may execute computer-readable instructions to maintain a voltage difference between the focus ring and the bias electrode. The computer-executable instructions may control the power source and the variable capacitors to implement the voltage difference between the focus ring and the bias electrode.

In one embodiment, the substrate may be placed within a substrate holder within a plasma processing system. The substrate holder may or may not include a combination of the bias electrode and the focus ring, in which the bias electrode may support the center of the substrate and the focus ring may support the edge of the substrate. In some embodiments, the substrate may be electrostatically coupled to the bias electrode and may not be in physical contact with the focus ring.

Plasma may be generated within the chamber by applying power (e.g., 0V-10,000V) to the power electrode that may be above the substrate. The power may ignite or strike plasma using the one or more gases inside the chamber that may be maintained at sub-atmospheric pressure. The plasma density may be altered by applying different voltages to the bias electrode and the focus ring. In one set of embodiments, the focus ring voltage may be less than the bias voltage. For example, in one embodiment, the difference between the bias voltage and the focus ring voltage may be at least 5% less based on at least one of the voltages. This may apply for any voltage range that may be applied to each of the elements. In another embodiment, the focus ring voltage is at least 50V less than the bias voltage. In another specific embodiment, the focus ring voltage may be between 100V and 800V less than the bias voltage.

In these embodiments, the plasma processing system may receive different types of gases that may be ionized by, at least, the power electrode. The gases may include, but are not limited to, halogen-containing gas, a noble-containing gas, an oxygen-containing gas, or a combination thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. The substrate may include a round substrate with a diameter of at least 150 mm and may include, but is not limited to, the following elements: silicon, gallium, cadmium, or zinc.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
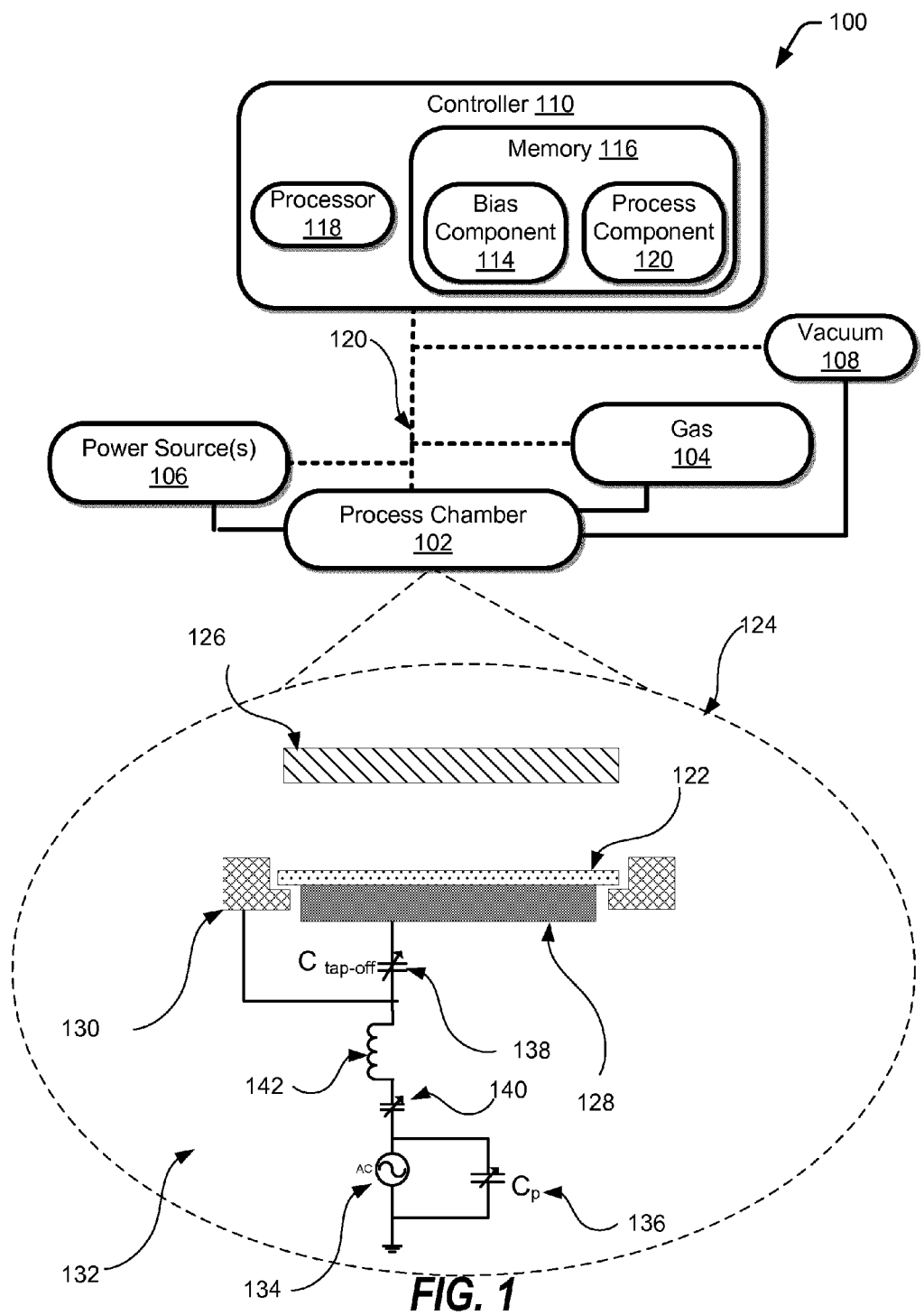
FIG. 1 is an illustration of a representative embodiment of a plasma processing system that shows a schematic of embodiment of the focus ring, substrate, bias electrode, and a potential control circuit.

FIG. 1 depicts a plasma processing system 100 for treating substrates using plasma (not shown) that is generated in a plasma chamber 102. Plasma may be generated in the plasma chamber 102 by ionizing gas that is provided by a gas delivery system 104 and exposing the gas to electromagnetic energy provided by a power source 106. A vacuum system 108 may also maintain a sub-atmospheric pressure within the plasma chamber 102 during plasma generation. The components of the plasma processing system 100 may be managed or controlled by a controller 110 that may include one or more computer processors 112 and memory components 116 that may store computer-executable instructions that may be executed by the computer processors or other logic/processing devices. The controller 110 may store recipe or process condition routines that may be implemented by controlling or directing the components of the plasma processing system 100 obtain certain conditions within the plasma chamber 102. Communication between the components may be implemented through processing and electrical communication techniques known to a person of ordinary skill in the art, as represented by the dashed lines 120.

The computer processors may include one or more processing cores and are configured to access and execute (at least in part) computer-readable instructions stored in the one or more memories. The one or more computer processors 602 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The computer processor may also include a chipset(s) (not shown) for controlling communications between the components of the plasma processing system 100. In certain embodiments, the computer processors may be based on Intel® architecture or ARM® architecture and the processor(s) and chipset may be from a family of Intel® processors and chipsets. The one or more computer processors may also include one or more application-specific integrated circuits (ASICs) or application-specific standard products (ASSPs) for handling specific data processing functions or tasks.

The memory may include one or more computer-readable storage media ("CRSM"). In some embodiments, the one or more memories may include non-transitory media such as random access memory ("RAM"), flash RAM, magnetic media, optical media, solid state media, and so forth. The one or more memories may be volatile (in that information is retained while providing power) or non-volatile (in that information is retained without providing power). Additional embodiments may also be provided as a computer program product including a transitory machine-readable signal (in compressed or uncompressed form). Examples of machine-readable signals include, but are not limited to, signals carried by the Internet or other networks. For example, distribution of software via the Internet may include a transitory machine-readable signal. Additionally, the memory may store an operating system that includes a plurality of computer-executable instructions that may be implemented by the processor to perform a variety of tasks to operate the plasma processing system 100.

Plasma generation may be done by applying electromagnetic energy to an electrically neutral gas to cause negatively charged electrons to be released from a gas molecule that is positively charged as result of the lost electron. Over time, the electromagnetic energy and the increasing electron collisions within the gas increase the density of ionized molecules within the gas, such that the ionized molecules may be influenced by potential differences within the plasma chamber 102. For example, the potential differences within the plasma chamber 102 may direct the ionize molecules (not shown) towards a substrate 122. The ionized molecules may interact with the substrate 122 or treat the substrate in a way that may remove a portion of the substrate or may be deposited unto the substrate. In this way, patterns may be etched into the substrate or films may be deposited onto the substrate 122.

Plasma density across the plasma chamber 102 may impact the uniformity of the plasma treatment of the substrate. The plasma density may be the ion molecule density within a volume within the plasma chamber 102. Plasma processing uniformity may be impacted when the plasma density varies across the substrate such that higher plasma density at the center of the substrate may cause a higher etch rate than the etch rate at the edge of the substrate. Generally, this process non-uniformity may be the result of ion loss to the chamber wall. One approach to resolve the non-uniformity may be to alter or generate a boundary potential that may minimize the impact ion 108 loss to reduce the plasma density uniformity across the substrate 122. A cross sectional view 124 of the plasma chamber 102 illustrates one embodiment of this approach.

In the FIG. 1 embodiment, the plasma chamber 102 may include a power electrode 126, a bias electrode 128, a focus ring 130, and a power control circuit 132. The substrate 122 may be disposed between the power electrode 126 and the bias electrode 128 and plasma may be generated in the region between the substrate 122 and the power electrode 126. Ions in the plasma may be directed towards the substrate 122 by applying a bias power or voltage to the bias electrode 128. However, a portion of the ions may also be attracted to the chamber wall (not shown) which may decrease the plasma density at the edges of the substrate 122 adjacent to the focus ring 130. One approach to remedy the non-uniformity may be to change the potential proximate to the edge of the substrate 122 to attract more ions to the lower plasma density regions. In one embodiment, the plasma density may be altered by applying a voltage to the focus ring 122 that is at a lower voltage or potential to the focus ring 130 than a bias voltage that may be applied to the bias electrode 128. The embodiment illustrated in the cross-section view 124 is just one implementation of this concept and does not limit the scope of the claims to the illustrated embodiment.

The bias electrode 128 may be configured to apply a biasing voltage to the substrate 122 to influence the plasma generated in conjunction with the power electrode 126. Additionally, the bias electrode 128 may include an electrostatic coupling (ESC) component (not shown) that may be used to secure the substrate 122 to the bias electrode 128 and/or the focus ring 130. The ESC component may prevent the substrate 122 from moving during the treatment. The bias electrode 128 may have a circular surface area that in contact with or subjacent to the substrate 122. The bias electrode 128 may distribute the biasing voltage across the substrate to generate a uniform potential across the substrate 122 surface area. The biasing voltage may attract ions from the plasma to the substrate 122 that may be used to etch the substrate 122 or deposit films on the substrate 122. In one embodiment, the biasing voltage may range between 0V and 10,000V and may vary depending on the process application for the substrate 122. However, as noted above, the bias voltage applied at or near the edge of the substrate 122 may be influenced by other boundary potentials within the plasma chamber 102. As a result, the uniform application of the bias voltage across the substrate 122 may not account for the boundary potentials at the edge of the substrate 122 resulting in less uniform plasma density at the edge of the substrate 122. One approach may be to apply another potential source at the edge of the substrate 122 to extend the plasma density uniformity across edge of the substrate 122. In one approach, a focus ring voltage may be applied to the focus ring 130 that surrounds the edge of the substrate 122.

The focus ring 130 ring positioned adjacent to the substrate 122 and may close enough to the edge of the substrate 122 to influence plasma density at or near the edge of the substrate 122. The focus ring 130 may be made of a dielectric material or combination of dielectric materials that may include, but is not limited to, quartz or ceramic materials. The focus ring voltage may be different than the bias voltage applied to the bias electrode 128. The focus ring voltage may be lower or higher than the bias voltage.

In the FIG. 1 embodiment, the power control circuit 132 may use the bias power source 134 to apply the focus ring voltage and the bias electrode voltage to their respective components. However, in other embodiments, the power control circuit 132 may include separate power sources for each component. But, in this embodiment, the power control circuit may include, but is not limited to, at least a bias power source 134, a power capacitor 136, a tap-off capacitor 138, a matching capacitor 140, and a matching inductor 142. As indicated in FIG. 1, the capacitors may be variable capacitors that may be varied by the controller 110. The power capacitors 136 may be used to condition the variation in the power signal provided from the bias power source 134 which may be, but is not required to be, a radio frequency power source that provides an alternating power signal to the bias electrode 128 and the focus ring electrode 130. The same power signal may be applied both of the electrodes, but the tap-off capacitor 138 may be used to increase the power signal to a higher voltage. The controller 110 may vary the capacitance (e.g., tap-off capacitor 138) to insure that the bias voltage is higher than the focus ring voltage by at least 5%. In another embodiment, the bias voltage may be no more than 50V higher than the focus ring voltage. In another embodiment, the bias voltage may be at least 100V higher and no more than 800V higher than the focus ring voltage. However, the different bias voltages may be applied or provided in a variety of ways and the scope of the claims is not limited to the FIG. 1 embodiment. The controller 110 may also monitor and control the impedance between the bias power source 136 and the plasma chamber 102. The controller may use the matching inductor 142 and the matching capacitor 140 to adjust the voltage, current, and or phase of the signal provided to the bias electrode 128 and/or the focus ring electrode 130. A person of ordinary skill in the art would comprehend how the controller 110 would adjust the voltage, current, and/or phase of the power to insure that the forward power provided to the plasma chamber 102 is matched to the reflected power from the plasma chamber 102.

The power electrode 126 may provide energy to ionize the gas within the plasma chamber 102. The energy may be provided by power source 106 that may include a direct current (DC) source (not shown) or an alternating frequency source (not shown). The power electrode 126 may be located opposite the substrate 122. In some embodiments, the power electrode 126 may generate a non-uniform plasma density across the substrate 122. In one instance, the plasma density may be higher proximate to the center of the substrate 122 than at the edge of the substrate 122. Hence, the plasma density non-uniformity caused by the loss of ions to the chamber wall may even be more pronounced due to the inherent performance of the design of the power electrode 126 and/or the power source 106. The plasma generated by the power electrode 126 may be influenced by the bias electrode 128 and/or the focus ring electrode 130.

Figure 2:
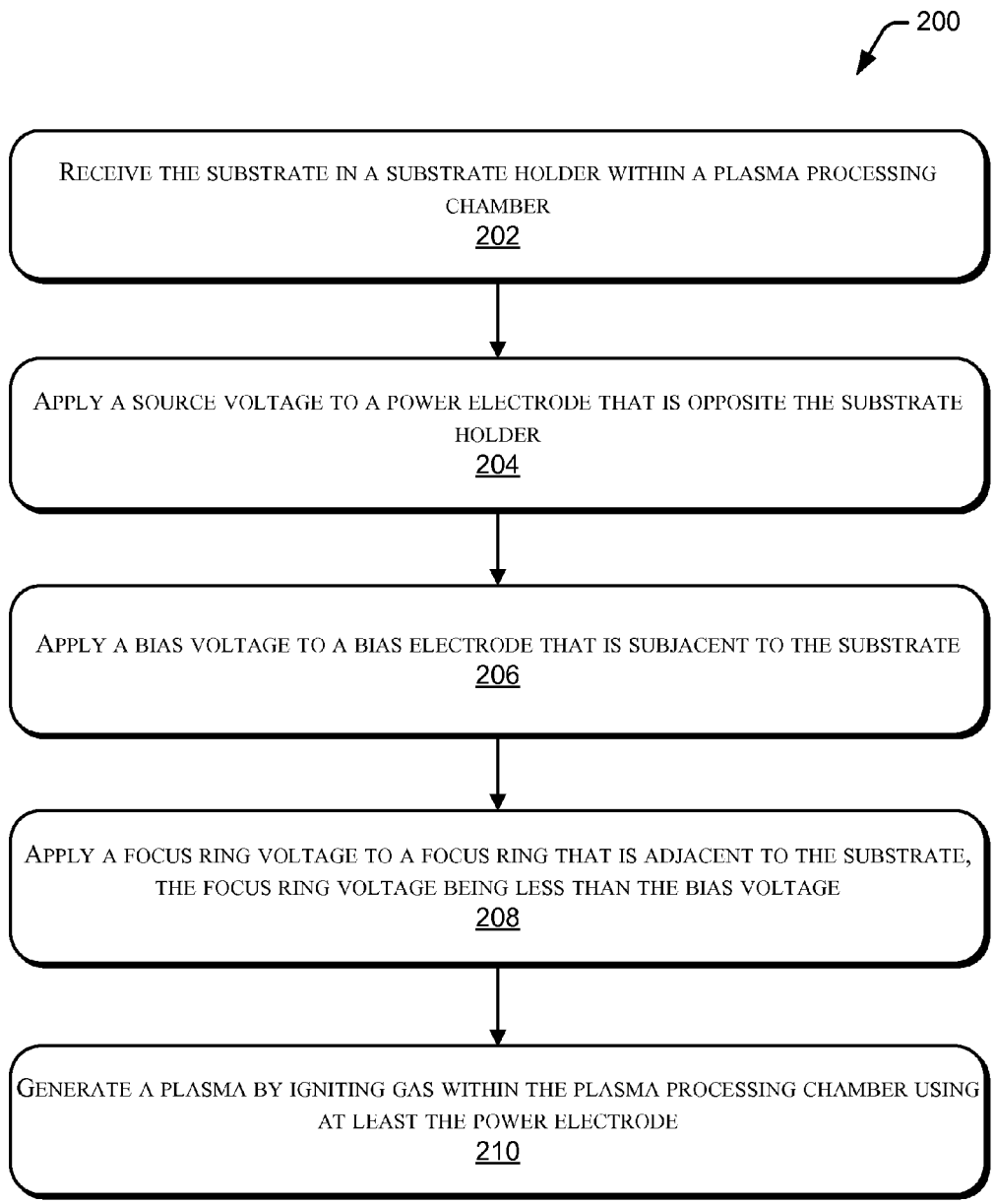
FIG. 2 is a flow diagram for a method for enabling a potential difference between the focus ring and the bias electrode of the plasma processing system.

FIG. 2 illustrates a flow diagram 200 for a method for controlling the plasma density across the substrate 122. One approach to increasing plasma density across the substrate 122 may be to minimize the loss of ions to the chamber wall that surround the plasma generated by the power electrode 126. In one embodiment, the plasma density at the edge of the substrate 122 less uniform than at the center of the substrate 122. As a result, the process performance or treatment of the substrate 122 may vary significantly between the edge and the center of the substrate 122. One approach to improve the plasma density non-uniformity at the edge may be to increase the potential at the edge to attract ions to the edge of the substrate 122 than the surrounding environment within the plasma chamber 102. As shown in the FIG. 1 embodiment, the focus ring 130 that is disposed adjacent to the substrate 122 and may be used to attract ions in conjunction with the bias electrode 128. In this way, the plasma density at the edge of the substrate 122 may be more uniform with the plasma density near the center of the substrate 122.

At block 202, the plasma chamber 102 may receive a substrate 122 and secure or place it in a substrate holder. The plasma chamber 102 may be a sub-atmospheric system that is facilitated by the vacuum system 108 and may receive gas(es) from the gas system 104. The types of gases may vary depending on the process. But, the gases may include, but are not limited to, a halogen-containing gas(es), a noble-containing gas(es), an oxygen-containing gas(es), or a combination thereof. In one embodiment, the substrate 122 may be secured to the substrate holder or bias electrode 128 by an electrostatic coupling initiated by the substrate holder. The substrate holder may include an electrostatic component that may generate an electromagnetic field applies a force that may prevent the substrate 122 from moving during the treatment.

The plasma chamber 102 may be used to generate plasma that may be used to treat the substrate. As noted above, the plasma may be generated by ionizing the gas received in the plasma chamber 102.

At block 204, the ionization of the gas may be implemented by the controller 110 directing the power source 106 apply a source voltage to a power electrode 126 that is opposite the substrate 122. However, in other embodiments, more than one electrode may be used to generate plasma; this may include the bias electrode 128 in some instances. The plasma density or ion density of the plasma may obtain a plasma density profile that may be indicative of the type of power source 106, power electrode 126, process gas, pressure, and temperature used for the treatment. For example, in one embodiment, the power source 106 may be a direct current (DC) source and in another embodiment, the power source 106 may be an alternating current (AC) source (e.g., radio frequency (RF), Microwave, etc.). In the DC embodiment, the plasma density profile may be a center-high profile that may indicate the plasma density is higher near the center of the substrate 122 than at the edge of the substrate 122. However, the plasma density profile may also have an edge-high profile that may indicate the plasma density is higher near the edge of the substrate 122 that at the center of the substrate 122. But, the interpretation of the claims is not limited to these two profiles which are providing for illustrative purposes. As noted above, the plasma density profile may be altered by changing the potential difference between the plasma and different components within the plasma chamber 102. One approach may be to vary the potential difference between different components within the plasma chamber 102.

In one set of embodiments, the power electrode 126 may receive a DC voltage between 0 volts and 10,000 volts from the power source 106. The power may vary process to process or may vary within a single process to address different applications used to etch or treat the substrate 122.

At block 206, the controller 110 may direct the bias power source 134 to apply a bias voltage to a bias electrode 128 that may be subjacent to the substrate 122. The bias electrode voltage may attract ions towards the substrate 122 to etch, deposit, or dope the substrate 122. The plasma density profile may be altered when the bias voltage is applied, but the potential difference between the plasma and other components in the plasma chamber 102 may still skew the plasma density, such that treatment may not be uniformly applied across the substrate 122. For example, the plasma density profile may still have a center-high profile when the bias voltage is applied to the bias electrode 128. However, the center-high profile may be adjusted by altering the potential difference between the plasma and the region proximate to the edge of the substrate 122. In one approach, the focus ring 130 may have a voltage applied to alter the potential difference at the edge region.

The controller 110 may also control the bias voltage by using the power control circuit 132 to vary the magnitude and/or frequency of the bias voltage using the tap-off capacitor 138 to tune the bias voltage or signal. In this way, the bias voltage may be higher or lower than the voltage provided by the bias power source 134. The bias voltage may form a sheath potential or Debye sheath at the surface of the substrate 122. The Debye sheath may be formed by a higher density of positive ions that forms the transition from plasma to a solid surface (e.g., substrate 122). The uniformity of the sheath potential across the substrate 122 may facilitate a more uniform plasma treatment of the substrate 122. However, the sheath potential may fall off near the edge of the substrate 122. One approach to improve edge uniformity may be to extend the sheath potential across the edge of the substrate in a more uniform manner. In one embodiment, a focus ring voltage may be applied to the focus ring electrode 130 to improve edge uniformity.

At block 208, the controller 110 may direct the power control circuit 132 to apply a focus ring voltage to the focus ring 130 that is adjacent to the substrate 122. In one embodiment, the focus ring voltage may be less than the bias voltage to improve sheath potential uniformity at the edge of the substrate 122. The difference between the focus ring voltage and the bias voltage may vary depending on the desired processing conditions. In one specific embodiment, the focus ring voltage may be at least 50V less than the bias voltage, regardless of the bias voltage which may be between 0V and 10,000V. In another specific embodiment, the focus ring voltage may be between 100V and 800V less than the bias voltage, regardless of the bias voltage. However, in another embodiment, the focus ring voltage may be dependent on the magnitude of the bias voltage. In this instance, the focus ring voltage may be at least 5% less than the bias voltage.

The focus ring voltage may increase the sheath potential uniformity at the edge of the substrate 122, such that the plasma treatment characteristics (e.g., etch rate) are more uniform between the center and edge of the substrate 122 than without the focus ring voltage.

At block 210, plasma may be generated by igniting gas within the plasma processing chamber using at least the power applied to the power electrode 126. The sheath potential formed at the surface of the substrate 122 may be varied by in magnitude and/or uniformity by the application of the bias voltage and/or the focus ring voltage to optimize the plasma treatment characteristics. In one embodiment, a plasma treatment characteristic may include, but is not limited to, etch rate uniformity across the substrate 122. Particularly, an improvement in the etch rate uniformity within 5 mm-15 mm from the edge of the substrate 122.

Figure 3:
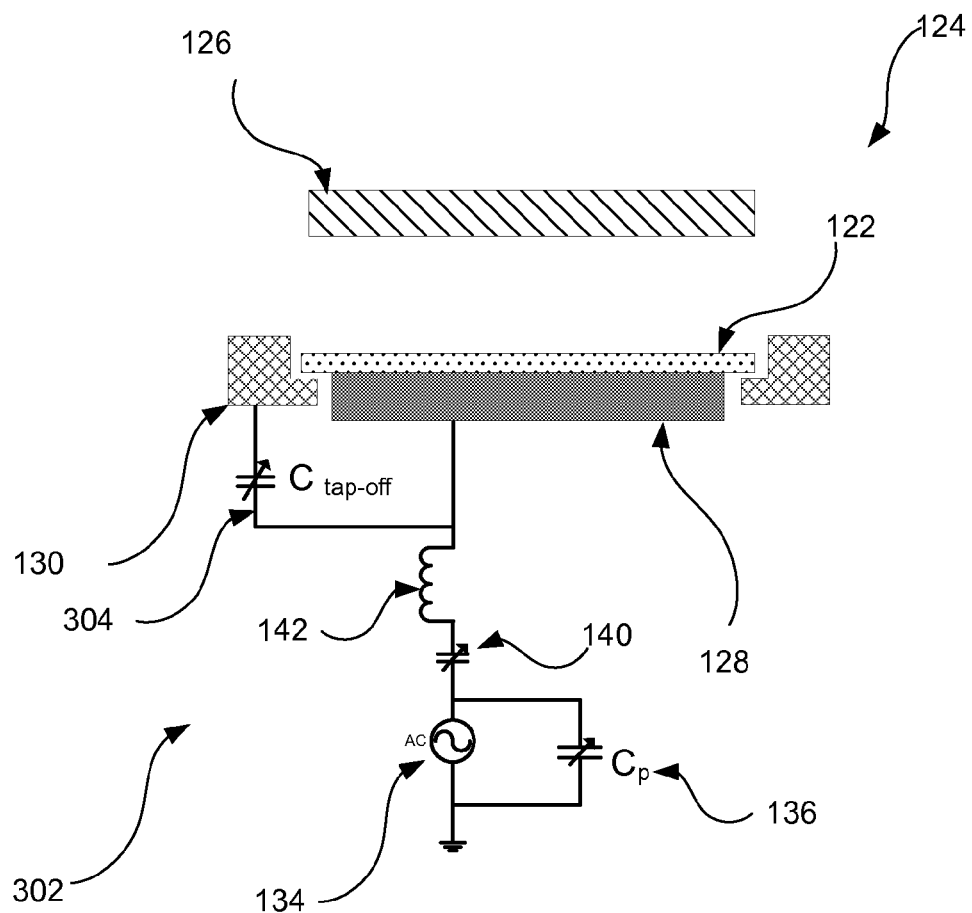
FIG. 3 is a schematic illustration of another embodiment for a potential control circuit for the plasma processing system.

FIG. 3 is a schematic illustration of another embodiment a plasma processing system 300 that may include a potential control circuit 302. The potential control circuit 302 may be integrated with the focus ring electrode 130 and the bias electrode 128 to control the potential difference between the two electrodes. The controller 110 may be used to adjust the potential difference, such that the focus ring electrode 130 may be a lower or higher potential than the bias electrode 128. In the FIG. 3 embodiment, the tap-off capacitor 304 may be disposed between the focus ring electrode 130 and the bias power source 134.

The tap-off capacitor 304 may be a variable capacitor that may vary the capacitance to enable a potential difference between the focus ring electrode 130 and the bias electrode 128. The plasma processing system 300 may be implemented in a similar method as described in the description of FIG. 2. The controller 110 may control the potential difference between the bias electrode and the focus ring electrode to at least a 5% difference based on the applied bias voltage. In other embodiments, the controller 110 may control the potential difference to be at least 50V or between 100V and 800V. As noted above, the potential difference may be used to improve the plasma treatment results at the edge of the substrate 122, such that the plasma density or process performance at the edge is more uniform to the plasma density or process performance near the center of the substrate 122.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for treating a substrate in a plasma processing system, comprising:
   receiving the substrate on a bias electrode within a plasma processing chamber;
   applying a source voltage to a power electrode that is opposite the bias electrode;
   applying, through a power control circuit, a bias voltage to the bias electrode that is subjacent to the substrate;
   applying, through the power control circuit, a focus ring voltage to a focus ring that is in direct contact with an edge of the substrate, the focus ring voltage being less than the bias voltage; and
   generating a plasma by igniting gas within the plasma processing chamber using at least the power electrode,
   wherein the power control circuit includes (i) a power source connected in parallel with a first variable capacitor, (ii) a matching capacitor and a matching inductor connected in series with the power source and the first variable capacitor, and (iii) a second variable capacitor having a first end connected to the focus ring and a second end connected to the matching inductor,
   wherein the power source includes a first end connected to a ground and the variable capacitor includes a first end connect to a ground, and
   wherein the power source includes a second end connected to the matching capacitor and the variable capacitor includes a second end connected to the matching capacitor.

2. The method of claim 1, wherein the focus ring voltage comprises a magnitude that is at least 50V less than the bias voltage.

3. The method of claim 2, wherein the applying of the power electrode comprises a magnitude between 0 volts and 10,000 volts.

4. The method of claim 1, wherein the focus ring voltage comprises a magnitude that is between 100V and 800V less than the bias voltage.

5. The method of claim 1, wherein the focus ring voltage comprises a magnitude that is at least 5% less than the bias voltage.

6. The method of claim 1, wherein the gas comprises a halogen-containing gas, a noble-containing gas, an oxygen-containing gas, or a combination thereof.

7. The method of claim 1, wherein the receiving comprises coupling the substrate to the bias electrode using an electrostatic component.

8. The method of claim 1, wherein the focus ring voltage comprises a magnitude that is less than the bias voltage by a value that is greater than 500V and less than or equal to 800V.

9. The method of claim 1, wherein the focus ring voltage is applied directly to the focus ring.

10. The method of claim 1, wherein the bias electrode is in direct contact with the substrate.

* * * * *